(12) United States Patent
Kim et al.

(10) Patent No.: US 7,706,196 B2
(45) Date of Patent: Apr. 27, 2010

(54) SEMICONDUCTOR MEMORY DEVICE

(75) Inventors: Kyung-Whan Kim, Kyoungki-do (KR); Ji-Eun Jang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 81 days.

(21) Appl. No.: 12/003,680

(22) Filed: Dec. 31, 2007

(65) Prior Publication Data

US 2009/0003096 A1 Jan. 1, 2009

(30) Foreign Application Priority Data

Jun. 26, 2007 (KR) .................... 10-2007-0063310

(51) Int. Cl.
*G11C 7/00* (2006.01)
(52) U.S. Cl. .................... 365/194; 365/193; 365/196; 365/225.7; 365/191
(58) Field of Classification Search ............... 365/194, 365/193, 196, 225.7, 191
See application file for complete search history.

(56) References Cited

U.S. PATENT DOCUMENTS

| | | | | |
|---|---|---|---|---|
| 5,544,105 | A * | 8/1996 | Hirose et al. ............ 365/189.11 |
| 6,219,218 | B1 * | 4/2001 | Nial et al. .................... 361/212 |
| 6,405,296 | B1 * | 6/2002 | Barth et al. .................. 711/167 |
| 6,418,067 | B1 * | 7/2002 | Watanabe et al. ........... 365/200 |
| 6,427,197 | B1 * | 7/2002 | Sato et al. .................... 711/169 |
| 6,438,043 | B2 * | 8/2002 | Gans et al. ................... 365/194 |
| 6,574,153 | B2 * | 6/2003 | Ware et al. ................... 365/194 |
| 6,778,459 | B2 * | 8/2004 | Blodgett .................. 365/225.7 |
| 6,944,090 | B2 * | 9/2005 | Anand et al. ........... 365/189.15 |
| 7,035,150 | B2 * | 4/2006 | Streif et al. .................. 365/194 |
| 2004/0032776 | A1 | 2/2004 | Kim et al. |
| 2005/0168259 | A1 | 8/2005 | Yamawaki |
| 2006/0018168 | A1 | 1/2006 | Kim |

FOREIGN PATENT DOCUMENTS

| | | |
|---|---|---|
| JP | 2-159815 | 6/1990 |
| JP | 2003-143240 | 5/2003 |
| JP | 2003-273712 | 9/2003 |
| JP | 2005-317124 | 11/2005 |
| JP | 2005-348296 | 12/2005 |
| KR | 10-2004-0054935 | 6/2004 |
| KR | 10-2006-0040965 | 5/2006 |

OTHER PUBLICATIONS

Korean Office Action, with English translation, issued in Korean Patent Application No. KR 10-2007-0063310, mailed Oct. 14, 2008.

* cited by examiner

*Primary Examiner*—Viet Q Nguyen
(74) *Attorney, Agent, or Firm*—IP & T Law Firm PLC

(57) ABSTRACT

A semiconductor memory device is provided to improve the tAA characteristics. The semiconductor memory device includes: a discrimination signal generating unit for generating a first discrimination signal denoting a write operation of the semiconductor memory device; a selective delay unit for delaying a command-group signal in response to a second discrimination signal; and a fuse unit for generating the second discrimination signal based on the first discrimination signal, the second discrimination signal determining whether the selective delay unit selectively delays the command-group signal in response to the first discrimination signal.

25 Claims, 6 Drawing Sheets

SEMICONDUCTOR MEMORY DEVICE

CROSS-REFERENCE TO RELATED APPLICATIONS

This application claims priority of Korean patent application number 10-2007-0063310, filed on Jun. 26, 2007, which is incorporated by reference in its entirety.

BACKGROUND OF THE INVENTION

The subject matter relates to a semiconductor memory device, and more particularly, to a semiconductor memory device capable of improving address access time (tAA) characteristics which denote a quality factor showing how fast data are output in response to a read command, and relates to performance of the semiconductor memory device.

FIG. 1 is a block diagram of a conventional semiconductor memory device having first to eighth banks.

As a storage capacity of a semiconductor memory device increases and high performance memory devices such as a double duty rate III (DDR3) dynamic random access memory (DRAM) device are employed, semiconductor memory devices have changed from a four-bank structure to an eight-bank structure. In the semiconductor memory device, a part corresponding to a data input/output pad is called a "DQ PAD," and a part corresponding to address and command input/output pads is called an "AC PAD".

As shown, a plurality of DQ PADs are located at one side of a chip, and a plurality of AC PADs are located at another side of the chip. Herein, the first to eighth banks are distant from or close to the DQ pads according to their positions, and the first to eighth banks are also distant from or close to the AC pads according to their positions. For example, the sixth bank BANK5 and the eighth bank BANK7, grouped by a reference symbol "DQ WORST" and "CMD BEST," are distant from the DQ PADs but close to the AC PADs. At another side of the chip, the first bank BANK0 and the third bank BANK2, grouped by a reference symbol "DQ BEST" and "CMD WORST," are distant from the AC PADs but close to the DQ PADs.

FIG. 2 is a timing diagram illustrating a write operation of the first to eighth banks of FIG. 1.

In detail, an upper portion of the timing diagram shows a write operation of the banks grouped by "DQ WORST" and "CMD BEST" in a fast process, voltage and temperature (PVT) condition. A lower portion of the timing diagram shows a write operation of the banks grouped by "DQ BEST" and "CMD WORST" in a slow PVT condition. Herein, the fast PVT condition means a PVT condition that optimum tAA characteristics can be obtained such as a semiconductor is manufactured through an optimum process and operates on high voltage and low temperature conditions. On the contrary, the slow PVT conditions means a PVT condition wherein the semiconductor memory device operates with the worst tAA characteristics. Further, the tAA characteristics denote a quality factor showing how fast data are output in response to a read command.

Data to be written to the banks (hereinafter, referring to as "write data") is transferred from the DQ PADs to the banks, and written to the banks in response to a bank write enable signal BWEN. The write data is written to a memory cell at a column side in response to a column selection signal YS, which is selected based on a column address. The column selection signal YS may be enabled at substantially the same time as an activation of the bank write enable signal BWEN, with a little time delay. Further, the column selection signal YS is delayed or advanced according as the bank write enable signal BWEN is advanced or delayed.

In general, since the write data transferred to the banks are intended to have the least delay time, the number of logic gates passed by the write data is designed to be minimized. The write data are merely transferred to the banks via a long metal line, e.g., a global input/output (GIO) line. The GIO line may have characteristics of a RC delay and a little variation between the fast PVT conditions and the slow PVT conditions. The GIO line is classified as a data-group transmission line, and thus the write data transferred via the GIO line are classified as a data-group signal. A time margin "$t_{GIO}$" shown in FIG. 2 denotes a time difference caused GIO line characteristics on according to PVT variation.

On the contrary, the bank write enable signal BWEN and the column selection signal YS are more sensitive to the PVT conditions because they pass through a relatively large number of logic gates, e.g., a timing controlling circuit and other controllers. Such signals as the bank write enable signal BWEN and the column selection signal YS are classified as a command-group signal. A time margin "$t_{CMD}$" shown in FIG. 2 denotes a time difference caused by PVT variation on the command-group signal. Herein, the time margin "$t_{CMD}$" is larger than the time margin "$t_{GIO}$".

It is required that the data-group signal such as the write data reaches the banks prior to the command-group signal such as the bank write enable signal BWEN and the column selection signal YS so as to satisfy a timing margin "$t_{MARGIN}$" shown in FIG. 2. However, the command-group signal sensitively varies according to the PVT conditions. In the fast PVT condition, the command-group signal may be much faster than in other conditions relatively to the data-group signal. Because of this, sometimes the timing margin "$t_{MARGIN}$" can not be guaranteed. Accordingly, it is required that the command-group signal may be delayed for a predetermined time by design. In particular, for the banks grouped by "DQ WORST" and "CMD BEST" as shown in the upper portion of the timing diagram of FIG. 2, it is necessary for the command-group signal, such as the bank write enable signal BWEN and the column selection signal YS, to be delayed.

The lower portion of the timing diagram shown in FIG. 2 shows the write operation of the banks grouped by "DQ BEST" and "CMD WORST" in slow PVT conditions. In such conditions, the command-group signal such as the bank write enable signal BWEN and the column selection signal YS is very slowly transferred to the banks but the data-group signal such as the write data is transferred to the banks relatively faster than the command-group signal. This is because the data-group signal is transferred to the banks located at "DQ BEST" and is relatively insensitive to PVT conditions, while the command-group signal is transferred to the banks located at "CMD WORST" and delayed for the predetermined time by design for guaranteeing the timing margin "$t_{MARGIN}$" in the fast PVT conditions.

In a read operation as well as the write operation, the column selection signal YS is enabled so that read data are transferred to the GIO line from the banks. In that case, there is a problem that the tAA is increased because the column selection signal YS is delayed as described above. The tAA characteristics relate to a quality factor showing how fast read data are output in response to a read command to thereby determine performance of the semiconductor memory device.

SUMMARY OF THE INVENTION

Embodiments of the present invention are directed to providing a semiconductor memory device capable of improving tAA characteristics which denote a quality factor showing how fast data are outputted on inputting of a read command, and determines performance of the semiconductor memory device.

In accordance with an aspect of the present invention, there is provided a semiconductor memory device, including: a discrimination signal generating unit for generating a first discrimination signal denoting a write operation of the semiconductor memory device; a selective delay unit for delaying a command-group signal in response to a second discrimination signal; and a fuse unit for generating the second discrimination signal based on the first discrimination signal, the second discrimination signal determining whether the selective delay unit selectively delays the command-group signal in response to the first discrimination signal.

In accordance with another aspect of the present invention, there is provided a semiconductor memory device, including: a data-group transmission line for transferring data input to and output from a memory cell; a command-group transmission line for transferring a command-group signal including a command signal and an address signal of the semiconductor memory device; and a fuse unit for determining whether to perform a selective delay operation or not, wherein during the selective delay operation the command-group transmission line has a delay amount in a write operation larger than that in a read operation.

DESCRIPTION OF SPECIFIC EMBODIMENTS

Hereinafter, a semiconductor memory device capable of improving tAA characteristics in accordance with exemplary embodiments of the present invention will be described in detail with reference to the accompanying drawings.

Figure 1:
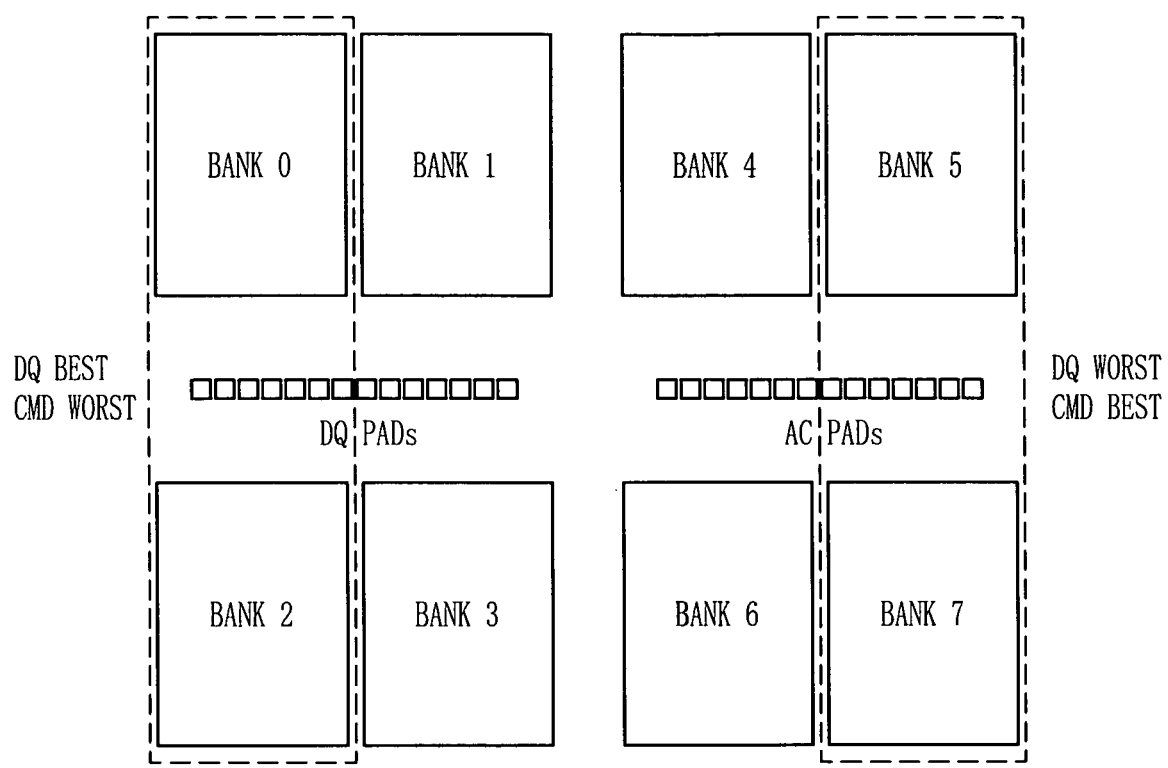
FIG. 1 is a block diagram of a conventional semiconductor memory device having eight banks.
Figure 2:
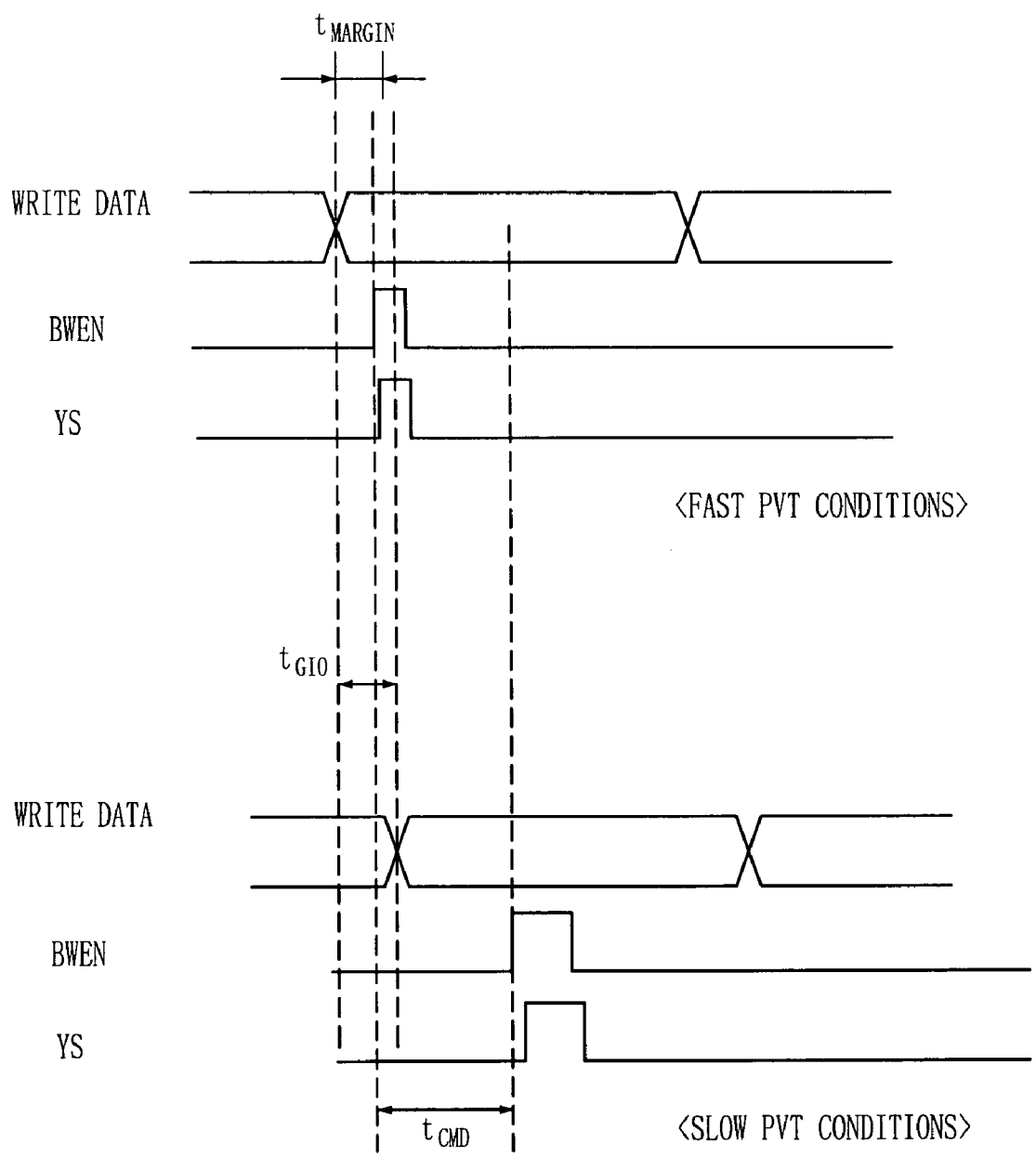
FIG. 2 is a timing diagram illustrating a write operation of the eight banks of FIG. 1.
Figure 3:
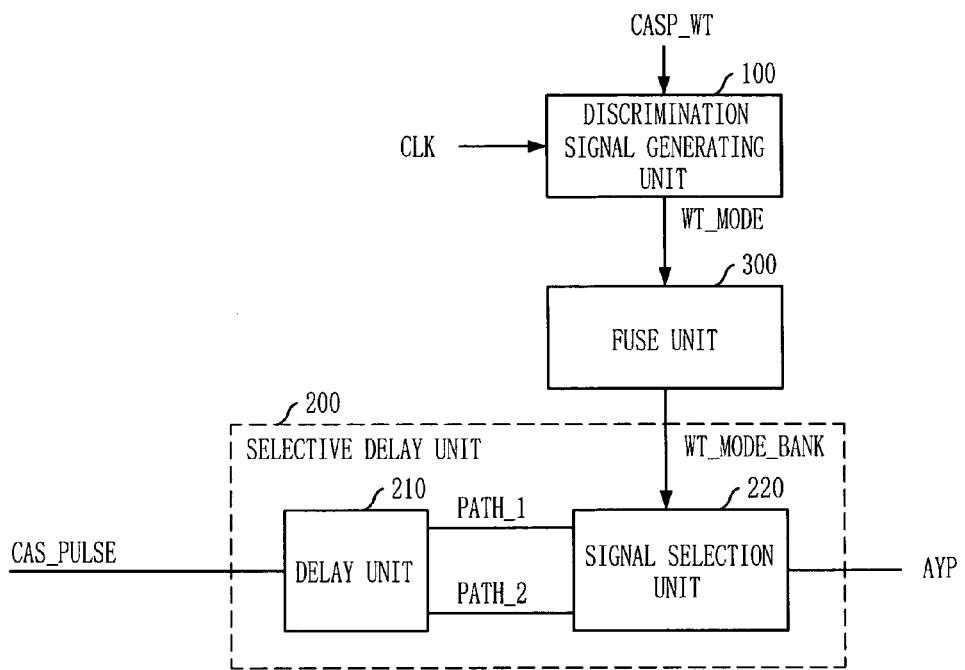
FIG. 3 is a block diagram illustrating a command-group signal transmission line of a semiconductor memory device in accordance with an embodiment of the present invention.

FIG. 3 is a block diagram illustrating a command-group signal transmission line of a semiconductor memory device in accordance with an embodiment of the present invention.

As illustrated, the semiconductor memory device includes a discrimination signal generating unit 100, a selective delay unit 200 and a fuse unit 300, for improving tAA characteristics by selectively delaying a command-group signal CAS_PULSE.

The discrimination signal generating unit 100 generates a first discrimination signal WT_MODE denoting a write operation of the semiconductor memory device. The command-group signal CAS_PULSE, which is source signal for generating a bank write enable signal BWEN and a column selection signal YS, is selectively delayed according to whether the semiconductor memory device is performing a write operation or a read operation. That is, the discrimination signal generating unit 100 generates the first discrimination signal WT_MODE denoting that the semiconductor memory device is performing a write operation, and thus the command-group signal CAS_PULSE can be delayed a large amount during the write operation.

The fuse unit 300 generates a second discrimination signal WT_MODE_BANK based on the first discrimination signal WT_MODE so as to determine whether or not the selective delay unit 200 performs a selective delay operation with a different delay value as the semiconductor memory device performs the write operation. That is, the selective delay unit 200 performs the selective delay operation in response to the second discrimination signal WT_MODE_BANK, or performs a constant delay operation regardless of the second discrimination signal WT_MODE_BANK. In detail, the fuse unit 300 outputs the first discrimination signal WT_MODE as the second discrimination signal WT_MODE_BANK, or outputs the second discrimination signal WT_MODE_BANK with a preset logic level according to whether an internal fuse is cut or not.

The selective delay unit 200 selectively delays the command-group signal CAS_PULSE in response to the second discrimination signal WT_MODE_BANK output by the fuse unit 300. In detail, the selective delay unit 200 increases a delay amount of the command-group signal CAS_PULSE in response to the second discrimination signal WT_MODE_BANK enabled when the semiconductor memory device performs the write operation. The selective delay unit 200 decreases a delay amount of the command-group signal CAS_PULSE when the second discrimination signal WT_MODE_BANK is disabled. Further, when the fuse unit 300 outputs the second discrimination signal WT_MODE_BANK with a preset logic level, the selective delay unit 200 does not perform the selective delay operation.

In detail, the selective delay unit 200 includes a delay unit 210 and a signal selection unit 220A. The delay unit 210 delays the command-group signal CAS_PULSE to output first and second delay command signals PATH_1 and PATH_2. The signal selection unit 220A selects one of the first and second delay command signals PATH_1 and PATH_2 in response to the second discrimination signal WT_MODE_BANK to output the selected delay command signal as a source signal AYP.

The discrimination signal generating unit 100 can be shared by all banks of the semiconductor memory device, but a selective delay unit 200 and a fuse unit 300 are provided in each bank. Accordingly, it is possible to set some banks to perform the selective delay operation, and some banks not to perform the selective delay operation, according to a distance from each bank to a pad. As the number of banks of the semiconductor memory device increases and the distance from each bank to the pad varies, it is useful to determine whether or not the selective delay operation is performed at each bank. Further, an operation mode of the semiconductor memory device, e.g., X8 and X16, may be set after fabricating, and an operating timing of the bank may be adjusted according to the operation mode. In such cases, it is advantageous that a selective delay unit 200 and a fuse unit 300 are provided in each bank.

Figure 4:
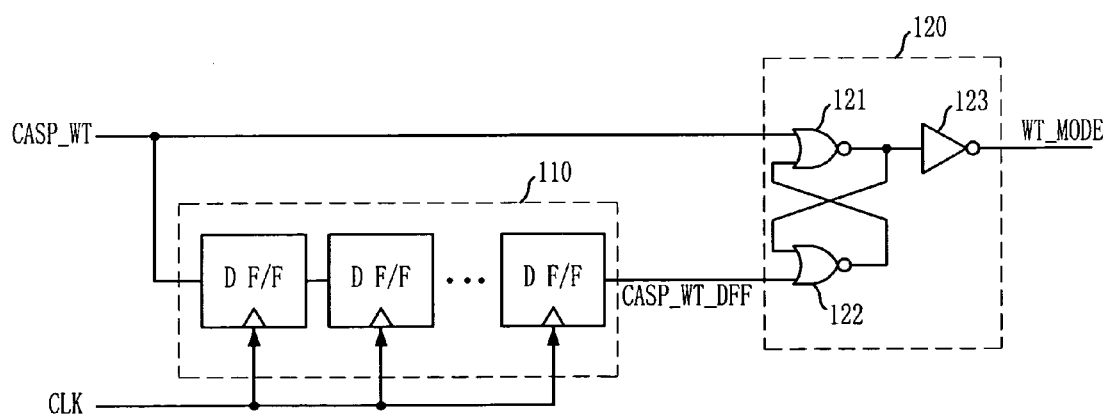
FIG. 4 is a circuit diagram illustrating a discrimination signal generating unit shown in FIG. 3.

FIG. 4 is a circuit diagram illustrating the discrimination signal generating unit 100 of FIG. 3.

The discrimination signal generating unit 100 generates the first discrimination signal WT_MODE denoting the write operation of the semiconductor memory device. The first discrimination signal WT_MODE can be generated by combining one or more signals relating to the write operation.

In accordance with the embodiment, the first discrimination signal WT_MODE is generated in response to an internal write command signal CASP_WT. The internal write command signal CASP_WT is a pulse signal generated by a column address strobe (CAS) command signal corresponding to a write command. The internal write command signal CASP_WT is enabled during the write operation of the semiconductor memory device.

When the internal write command signal CASP_WT is enabled, the first discrimination signal WT_MODE is enabled for a preset time and disabled after the preset time. Herein, the preset time means a time interval for the write operation of the semiconductor memory device. Because the internal write command signal CASP_WT is a pulse enabled for a short time, it is difficult for the semiconductor memory device to guarantee the time interval for the write operation of the semiconductor memory device. Thus, the first discrimination signal WT_MODE is adjusted so as to be enabled at substantially the same time as the internal write command signal CASP_WT and disabled after the preset time for guaranteeing the time interval for the write operation of the semiconductor memory device. Because the command-group signal CAS_PULSE is delayed while the first discrimination signal WT_MODE is enabled, it is important to determine a time when the first discrimination signal WT_MODE is enabled.

Referring to FIG. 4, the discrimination signal generating unit 100 includes a delay unit 110 and a latch unit 120. The delay unit 110 delays the internal write command signal CASP_WT to output a delayed write command signal CASP_WT_DFF. The latch unit 120 latches the internal write command signal CASP_WT in response to the delayed write command signal CASP_WT_DFF to output the latched signal as the first discrimination signal WT_MODE.

The delay unit 110 includes one or more D flip-flops connected in series. A delay amount of the delay unit increases as the number of the D flip-flops increases.

The latch unit 120 may be implemented with a set-reset (SR) latch. The latch unit 120 includes first and second NOR gate 121 and 122, and an inverter 123. The first NOR gate 121 performs a NOR operation on the internal write command signal CASP_WT and an output signal of the second NOR gate 122. The second NOR gate 122 performs a NOR operation on the delayed write command signal CASP_WT_DFF and an output signal of the first NOR gate 121, thereby forming a SR latch with the first NOR gate 121. The inverter 123 inverts the output signal of the first NOR gate 121 to output the first discrimination signal WT_MODE.

Figure 5:
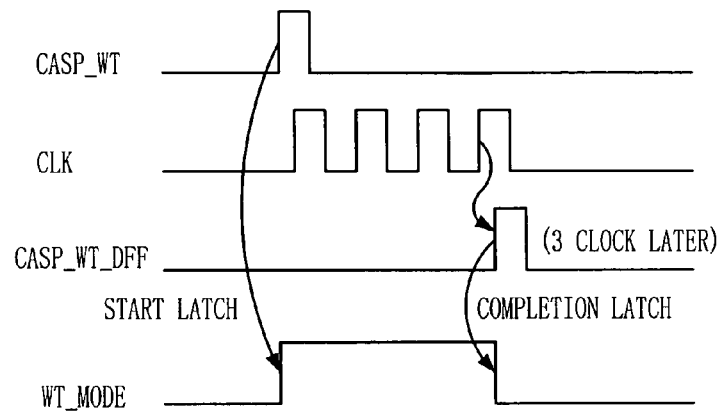
FIG. 5 is a timing diagram illustrating operation of the discrimination signal generating unit shown in FIG. 4.

FIG. 5 is a timing diagram illustrating operation of the discrimination signal generating unit 100 shown in FIG. 4.

As shown, if the internal write command signal CASP_WT is enabled, the first discrimination signal WT_MODE is enabled. After three clocks, the delay write command signal CASP_WT_DFF is enabled so that the first discrimination signal WT_MODE is disabled.

Referring to FIG. 5, while an embodiment having the first discrimination signal WT_MODE enabled during three clocks is described, the enabled time of the first discrimination signal WT_MODE may be changed and modified according to a time interval for the write operation and an operating speed of the semiconductor memory device. Further, although the delay unit 110 using the D flip-flops and the latch unit 120 using the SR latch are explained as an example, the delay unit 110 may be implemented with an inverter delay and the SR latch may be implemented with NAND gates, instead of NOR gates.

Figure 6:
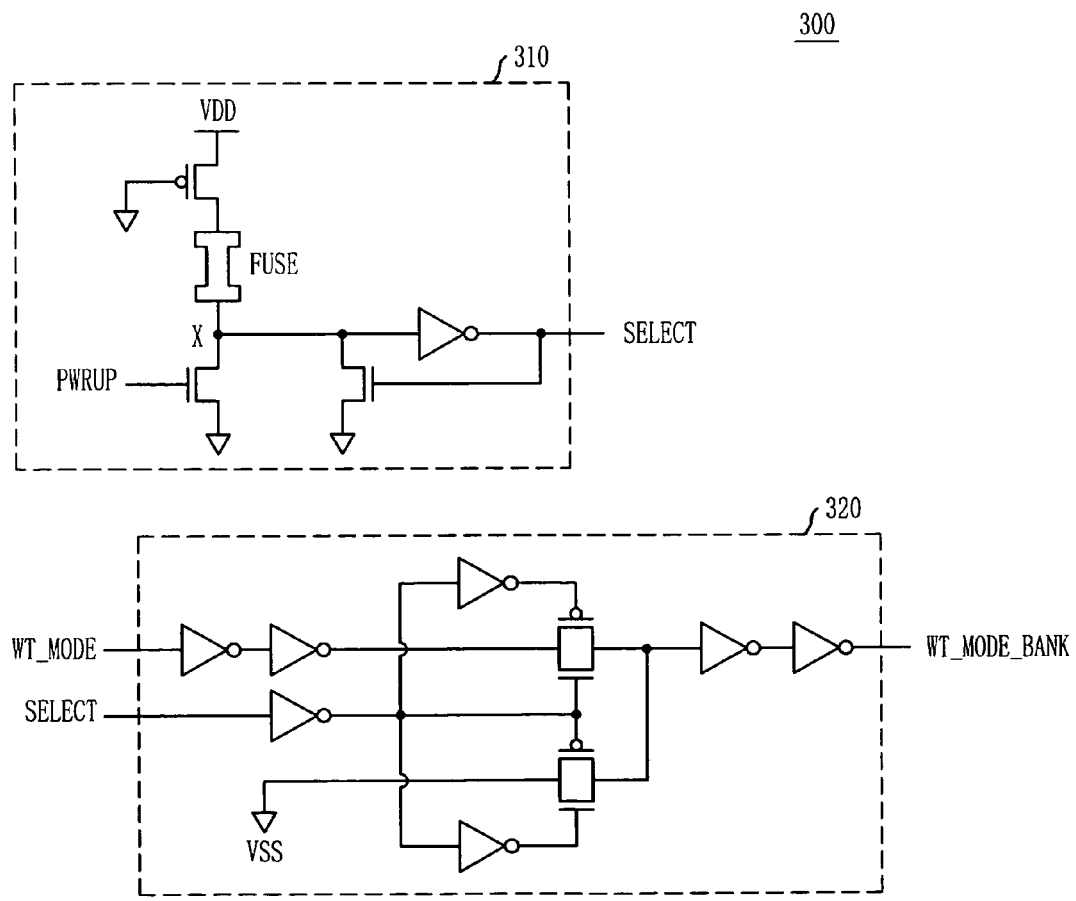
FIG. 6 is a circuit diagram illustrating a fuse unit shown in FIG. 3.

FIG. 6 is a circuit diagram illustrating the fuse unit 300 shown in FIG. 3.

As shown, the fuse unit 300 includes a fuse option unit 310 and a signal selection unit 320.

The fuse option unit 310 outputs a selection signal SELECT with a logic high level when the internal fuse is cut, and a logic low level when the internal fuse is not cut. For reference, a power up signal PWRUP is a pulse signal activated with a logic high level for a short time when a power source is applied at an initial stage.

The signal selection unit 320 outputs the second discrimination signal WT_MODE_BANK with a logic low level of a ground voltage VSS when the selection signal SELECT is at a logic high level, and outputs the first discrimination signal WT_MODE as the second discrimination signal WT_MODE_BANK when the selection signal SELECT is at a logic low level.

Figure 7:
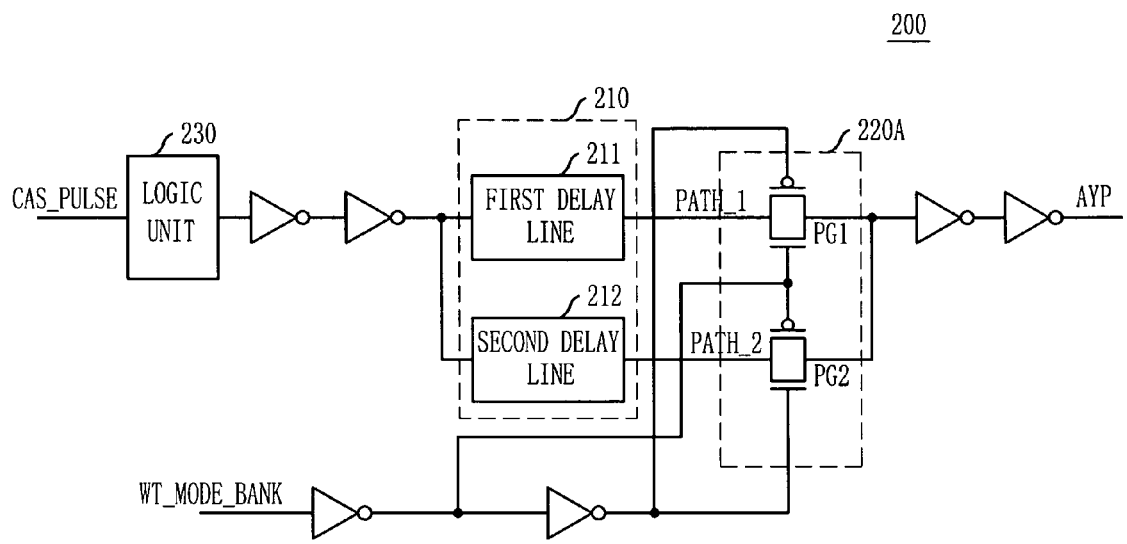
FIG. 7 is a circuit diagram illustrating a selective delay unit shown in FIG. 3 in accordance with a first embodiment of the present invention.

FIG. 7 is a circuit diagram illustrating the selective delay unit 200 shown in FIG. 3 in accordance with a first embodiment of the present invention.

As shown, the selective delay unit 200 includes the delay unit 210 and the signal selection unit 220A. The delay unit 210 delays the command-group signal CAS_PULSE to output the first and second delay command signals PATH_1 and PATH_2. The signal selection unit 220A selects one of the first and second delay command signals PATH_1 and PATH_2 in response to the second discrimination signal WT_MODE_BANK to output the selected delay command signal as the source signal AYP.

Hereinafter, prior to describing the selective delay unit 200 in detail, signals shown in FIG. 7 are explained below.

First, the command-group signal CAS_PULSE is an initial command signal for a column access of the semiconductor memory device. In general, the command-group signal CAS_PULSE passes through a plurality of logic gates and is output as the source signal AYP.

The source signal AYP is used to generate the bank write enable signal BWEN and the column selection signal YS. Timings of the bank write enable signal BWEN and the column selection signal YS are adjusted by controlling a timing of the source signal AYP. For reference, an internal write command signal CASP_WT can be generated in response to the command-group signal CAS_PULSE.

While the above signals are explained as an example, it will be apparent to those skilled in the art that various changes and modifications may be made without departing from the spirit and scope of the invention.

The delay unit 210 includes first and second delay lines 211 and 212. The first delay line 211 is used for a read operation of the semiconductor memory device and the second delay line 212 is used for a write operation of the semiconductor memory device. Each of the first and second delay lines 211 and 212 delays the command-group signal CAS_PULSE for different amounts of time. It is desired to increase the delay amount of the command-group signal CAS_PULSE during the write operation of the semiconductor memory device. Therefore, the delay amount of the second delay line 212 is larger than that of the first delay line 211.

Further, a difference in delay amounts between the first delay line 211 and the second delay amount 212 is more significant than the individual delay amounts of the first and second delay lines 211 and 212. Accordingly, it is possible to set the delay amount of the first delay line 211 to zero by implementing the first delay line 211 with a line.

The signal selection unit 220A includes first and second pass gates PG1 and PG2, each of which receives a corresponding one of output signals of the first and second delay lines 211 and 212.

The first and second pass gates PG1 and PG2 are enabled and disabled in response to the second discrimination signal WT_MODE_BANK. In detail, when the second discrimination signal WT_MODE_BANK is enabled, the second pass gate PG2 is enabled so that the source signal AYP is delayed as much as the delay amount of the second delay line 212, i.e., with a large delay amount. Alternatively, when the second discrimination signal WT_MODE_BANK is disabled, the first pass gate PG1 is enabled so that the source signal AYP is delayed as much as the delay amount of the first delay line 211, i.e., with a small delay amount.

For reference, a logic unit 230 includes a plurality of logic gates that the command-group signal CAS_PULSE passes through to generate an intermediate source signal, thereby outputting the source signal AYP.

As described above, in a conventional semiconductor memory device, the command-group signal is delayed to guarantee the time margin of the write operation in the fast PVT conditions by design. As a result, this sacrifices tAA characteristics for a read operation of the conventional semiconductor memory device.

On the contrary, in the disclosed embodiments, the command-group signal is delayed for a write operation for a predetermined delay amount larger than a delay used for a read operation. Accordingly, the command-group signal is not meaninglessly delayed in the read operation, thereby improving the tAA characteristics for determining the performance of the semiconductor memory device.

Figure 8:
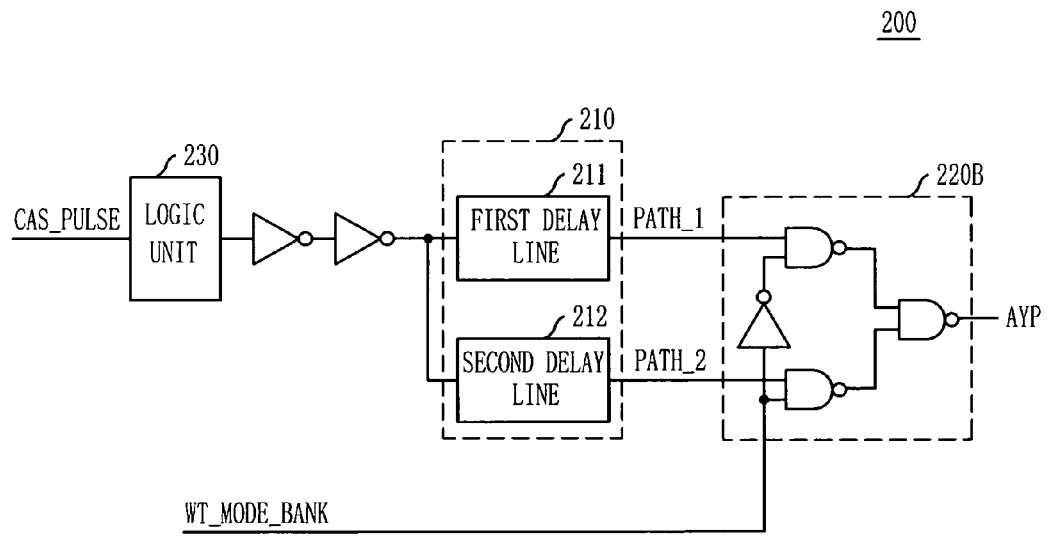
FIG. 8 is a circuit diagram illustrating a selective delay unit shown in FIG. 3 in accordance with a second embodiment of the present invention.

FIG. 8 is a circuit diagram illustrating the selective delay unit 200 shown in FIG. 3 in accordance with a second embodiment of the present invention.

The selective delay unit 200 in accordance with the second embodiment is substantially the same as that of the first embodiment except for the signal selection unit 220B.

As shown, the signal selection unit 220B is implemented with a plurality of NAND gates instead of the first and second pass gates PG1 and PG2, so as to select one of the first and second delay command signals PATH_1 and PATH_2 in response to the second discrimination signal WT_MODE_BANK to output the selected delay command signal as the source signal AYP.

Figure 9:
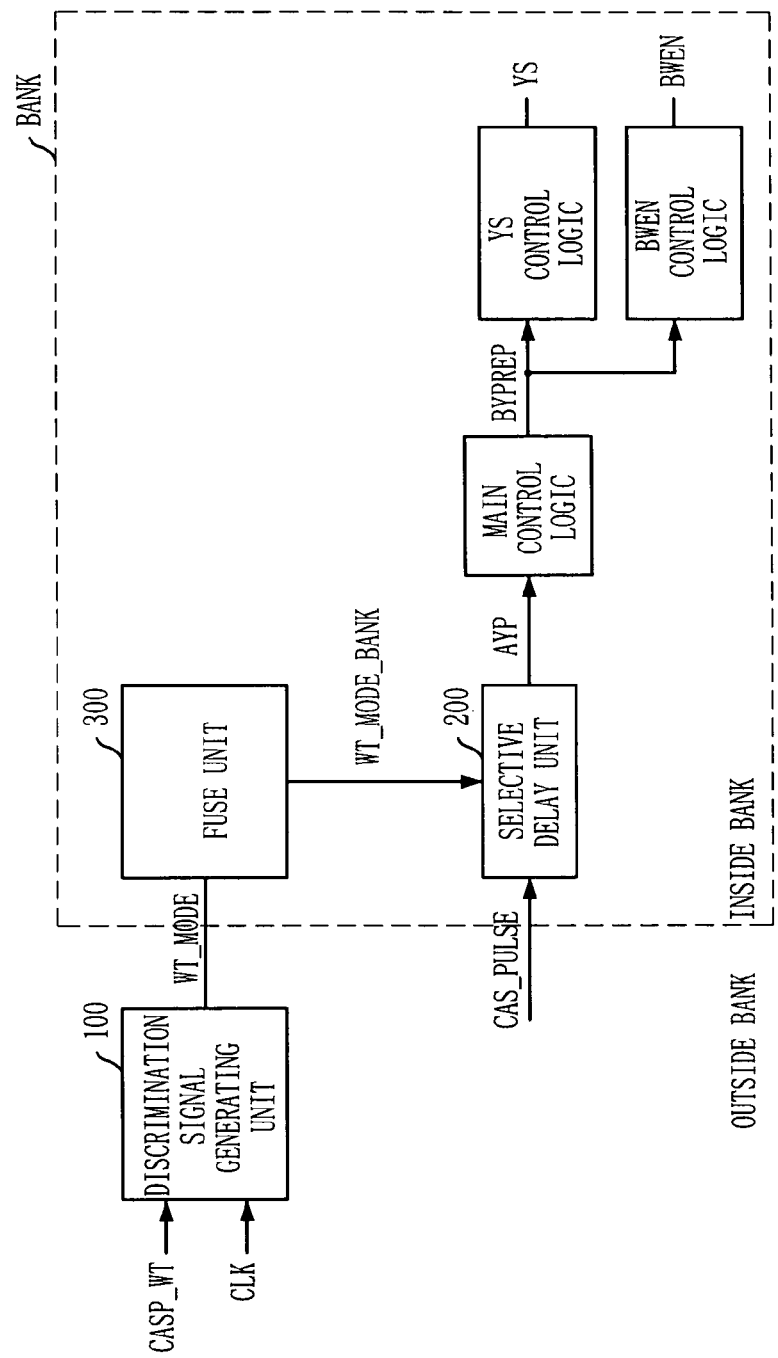
FIG. 9 is a diagram illustrating an arrangement of the discrimination signal generating unit, the selective delay unit and the fuse unit shown in FIG. 3.

FIG. 9 is a diagram illustrating an arrangement of the discrimination signal generating unit 100, the selective delay unit 200 and the fuse unit 300 shown in FIG. 3.

As shown, the discrimination signal generating unit 100 is located outside the bank so as to be shared by other banks, and a selective delay unit 200 and a fuse unit 300 are located inside each bank.

Each bank includes control logics for generating the bank write enable signal BWEN and the column selection signal YS based on the source signal AYP. In detail, a main control logic receives the source signal AYP to generate intermediate source signal BYPREP according to a burst length BL. In general, the intermediate source signal BYPREP is activated once when the burst length BL is set to 4, and the intermediate source signals BYPREP is activated twice when the burst length BL is set to 8. A YS control logic receives the intermediate source signal BYPREP to generate the column selection signal YS, and a BWEN control logic receives the intermediate source signal BYPREP to generate the bank write enable signal BWEN.

As described with respect to the above embodiments, the command-group signal is delayed for a write operation for a predetermined delay amount larger than that for a read operation. Accordingly, the command-group signal has a reduced delay in the read operation to thereby improve the tAA characteristics for determining the performance of the semiconductor memory device.

Further, the selective delay operation can be selectively performed according to a location of each bank because each bank respectively includes a selective delay unit 200 and a fuse unit 300.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a discrimination signal generating unit for generating a first discrimination signal denoting a write operation of the semiconductor memory device;
    a selective delay unit for delaying a command-group signal in response to a second discrimination signal; and
    a fuse unit for generating the second discrimination signal based on the first discrimination signal, the second discrimination signal determining whether the selective delay unit selectively delays the command-group signal in response to the first discrimination signal.

2. The semiconductor memory device as recited in claim 1, wherein the semiconductor memory device includes a plurality of banks and the selective delay unit and the fuse unit are provided in each bank.

3. The semiconductor memory device as recited in claim 1, wherein the command-group signal includes source signals for generating the bank write enable signal or the column selection signal.

4. The semiconductor memory device as recited in claim 1, wherein the fuse unit outputs as the second discrimination signal one of the first discrimination signal and a preset logic level according to whether an internal fuse is cut or not.

5. The semiconductor memory device as recited in claim 4, wherein the fuse unit includes:
    a fuse option unit for outputting a selection signal with one of a first and second logic levels according to whether the internal fuse is cut; and
    a signal selection unit for outputting the second discrimination signal with the preset logic level when the selection signal is at the first logic level, and outputting the first discrimination signal as the second discrimination signal when the selection signal is at the second logic level.

6. The semiconductor memory device as recited in claim 1, wherein the discrimination signal generating unit generates the first discrimination signal in response to an internal write command signal.

7. The semiconductor memory device as recited in claim 6, wherein the discrimination signal generating unit enables the first discrimination signal for a predetermined time when the internal write command is enabled.

8. The semiconductor memory device as recited in claim 7, wherein the predetermined time is a time interval corresponding to the write operation of the semiconductor memory device.

9. The semiconductor memory device as recited in claim 7, wherein the discrimination signal generating unit includes:
a delay unit for delaying the internal write command signal to output a delayed write command signal; and
a latch unit for latching the internal write command signal in response to the delayed write command signal to output the first discrimination signal.

10. The semiconductor memory device as recited in claim 9, wherein the delay unit includes one or more D flip-flops in series.

11. The semiconductor memory device as recited in claim 9, wherein the latch unit includes a set-reset (SR) latch.

12. The semiconductor memory device as recited in claim 1, wherein, when the selective delay unit selectively delays the command-group signal in response to the first discrimination signal, the selective delay unit delays the command-group signal in the write operation for a predetermined delay amount larger than it delays the command-group signal for a read operation.

13. The semiconductor memory device as recited in claim 12, wherein the selective delay unit includes:
a delay unit, for delaying the command-group signal, outputting first and second delay command signals with different amounts of delay; and
a signal selection unit for selecting one of the first and second delay command signals in response to the second discrimination signal.

14. The semiconductor memory device as recited in claim 13, wherein the delay unit includes:
a first delay line having a first delay amount to output the first delay command signal; and
a second delay line having a second delay amount larger than the first delay amount to output the second delay command signal.

15. The semiconductor memory device as recited in claim 14, wherein the first delay amount is a zero value.

16. The semiconductor memory device as recited in claim 14, wherein the signal selection unit includes:
a first pass gate for outputting the first delay command signal; and
a second pass gate for outputting the second delay command signal.

17. The semiconductor memory device as recited in claim 16, wherein the first and second pass gates are enabled or disabled in response to the second discrimination signal.

18. A semiconductor memory device, comprising:
a data-group transmission line for transferring data input to and output from a memory cell; and
a command-group transmission line for transferring a command-group signal including a command signal and an address signal of the semiconductor memory device and performing a selective delay operation wherein the command-group transmission line includes:
a discrimination signal generating unit for generating a first discrimination signal that is enabled when the semiconductor memory device performs a write operation;
a fuse unit for generating a second discrimination signal determining whether to perform the selective delay operation in response to the first discrimination signal; and
a selective delay unit for increasing the delay amount of the command-group transmission line in response to the second discrimination signal.

19. The semiconductor memory device as recited in claim 18, wherein during the selective delay operation the command-group transmission line has a delay amount in a write operation larger than that in a read operation.

20. The semiconductor memory device as recited in claim 19, wherein the command-group signal includes source signals for generating a bank write enable signal or a column selection signal.

21. The semiconductor memory device as recited in claim 19, wherein the discrimination signal generating unit generates the first discrimination signal based on an internal write command signal.

22. The semiconductor memory device as recited in claim 21, wherein the discrimination signal generating unit enables the first discrimination signal for a preset time when the internal write command is enabled.

23. The semiconductor memory device as recited in claim 22, wherein the preset time is a time interval corresponding to the write operation of the semiconductor memory device.

24. The semiconductor memory device as recited in claim 19, wherein the fuse unit selects one of the first discrimination signal and a signal with a predetermined logic level and outputs the selected one as the second discrimination signal to the selective delay unit according to whether an internal fuse is cut or not.

25. The semiconductor memory device as recited in claim 19, wherein the semiconductor memory device includes a plurality of banks and the selective delay unit and the fuse unit are provided in each bank.

* * * * *